United States Patent
Foote et al.

(10) Patent No.: US 8,597,982 B2
(45) Date of Patent: Dec. 3, 2013

(54) METHODS OF FABRICATING ELECTRONICS ASSEMBLIES

(75) Inventors: David K. Foote, San Jose, CA (US); James D. Getty, Vacaville, CA (US); Jiangang Zhao, Concord, CA (US)

(73) Assignee: Nordson Corporation, Westlake, OH (US)

( * ) Notice: Subject to any disclaimer, the term of this patent is extended or adjusted under 35 U.S.C. 154(b) by 78 days.

(21) Appl. No.: 13/285,547

(22) Filed: Oct. 31, 2011

(65) Prior Publication Data

US 2013/0109136 A1    May 2, 2013

(51) Int. Cl.
*H01L 21/00*   (2006.01)

(52) U.S. Cl.
USPC ..... 438/107; 438/115; 438/612; 257/E21.499

(58) Field of Classification Search
USPC ......... 438/106, 107, 110, 111, 115, 123, 612; 257/E21.499, E21.508
See application file for complete search history.

(56) References Cited

U.S. PATENT DOCUMENTS

| | | | |
|---|---|---|---|
| 6,103,457 A * | 8/2000 | Gabriel | 430/318 |
| 6,413,576 B1 | 7/2002 | Ellis et al. | |
| 6,933,614 B2 | 8/2005 | Lee et al. | |
| 7,994,629 B2 * | 8/2011 | Camacho | 257/690 |
| 8,187,921 B2 * | 5/2012 | Yim et al. | 438/109 |
| 8,217,514 B2 * | 7/2012 | Pendse | 257/723 |
| 2004/0161528 A1 | 8/2004 | Martinez et al. | |
| 2005/0121310 A1 * | 6/2005 | Yamada et al. | 204/192.12 |
| 2009/0099512 A1 | 4/2009 | DiGregorio et al. | |
| 2009/0288773 A1 | 11/2009 | Bolden, II et al. | |
| 2010/0194505 A1 | 8/2010 | Brass et al. | |
| 2012/0068353 A1 * | 3/2012 | Huang et al. | 257/774 |
| 2012/0298301 A1 * | 11/2012 | Pandhumsoporn et al. | 156/345.24 |

OTHER PUBLICATIONS

USPTO, Office Action issued in related U.S. Appl. No. 13/025,717 dated Jan. 9, 2012.
Antonijevic et al., "Copper Corrosion Inhibitors, A review", Int. J. Electrochemi. Soc., 3, pp. 1-28, 2008.
Lin et al., "Effect of Plasma Polymer Deposition methods on Copper Corrosion Protection", J. of Applied Polymer Science, vol. 60, pp. 543-555, 1996.
Grassine, et al., "Advanced plasma treatment for cleaning and protecting precious metal artifacts", International Conference on Strategies for Saving Indoor Metallic Collections with a Satellite Meeting on Legal Issues in the Conservation of Cultural Heritage, pp. 127-131, Cairo-Egypt, Feb. 25-Mar. 1, 2007.

* cited by examiner

*Primary Examiner* — Tuan N. Quach
(74) *Attorney, Agent, or Firm* — Wood, Herron & Evans LLP

(57) ABSTRACT

In an embodiment of the present invention, a method is provided for fabricating an electronics assembly having a substrate and a plurality of circuit elements. The method includes forming a liquid barrier on the substrate, placing a first circuit element on one side of the liquid barrier, and placing a second circuit element on the opposite side of the liquid barrier. A liquid is applied to the first circuit element. The method further includes using the liquid barrier to prevent the liquid applied to the first circuit element from contaminating the second circuit element so that the spacing between the first and second circuit elements can be minimized.

9 Claims, 4 Drawing Sheets

METHODS OF FABRICATING ELECTRONICS ASSEMBLIES

BACKGROUND

The present invention relates generally to methods of fabricating electronics assemblies.

An electronics assembly may include one or more chips and a package carrier (such as a substrate, a circuit board, or a leadframe) to which each chip is attached. Electronics assemblies are found in virtually every electronic device constructed today. Each chip includes one or more integrated circuits fabricated using a wafer and an interconnect structure that facilitates connection of the devices with the external environment. The interconnect structure includes an array of electrically conductive contacts, known as bond pads, and intervening metals levels that couple the devices with the bond pads. Die cut from the wafer are mounted on the package carrier to form an electronics assembly.

Each die includes bond pads that are connected with bond pads on the package carrier to supply external electrical connections. In electronics assemblies formed by flip chip mounting, the bond pads on the die are electrically and physically connected by solder balls or bumps to a corresponding array of bond pads on a substrate, such as a package carrier. Typically, the solder bumps are registered with the bond pads on the die and/or substrate and reflow processes are applied to create physical and electrical connections in the form of solder joints. The process of flip chip mounting results in a gap between the die and the substrate that reflects the presence of the solder joints.

Frequently, an underfill is introduced into the gap between the die and the substrate and surrounding the solder bumps. The underfill is an electrically-insulating material that strengthens the mechanical bond between the die and substrate and protects the solder joints. The underfill is typically dispensed adjacent to one or more die edges and is drawn beneath the die by capillary action. However, the dispensed underfill has a tendency to migrate away from the dispensed location adjacent to the die and may contaminate an adjacent die. The resultant transport of underfill may lead to a premature failure of the electronics assembly. The probability of contamination of an adjacent die by underfill migration increases as the spacing between the adjacent die is reduced. Hence, underfill migration may be a limiting factor in establishing a minimum spacing between adjacent die in the electronics assembly.

In other types of electronics assemblies know as wire bond assemblies, the die is adhesively bonded to a die attach pad on a substrate. A wirebonding process is then used to couple wires between bond pads on the top surface of the die and bond pads distributed about the die attach pad. The bond pads are arranged about the outer circumference of the die attach pad. A die attach adhesive is dispensed onto the die attach pad. Because of their small size, the bond pads are highly sensitive to contamination by adhesive migrating from the die attach pad as a result of physically placing the die on the die attach pad.

Therefore, methods are needed for fabricating an electronics assembly that permit adjacent circuit elements to be positioned as close as physically possible without contamination of adjacent circuit elements from underfill or adhesive.

SUMMARY OF THE INVENTION

In an embodiment of the present invention, a method is provided for fabricating an electronics assembly having a substrate and a plurality of circuit elements. The method includes forming a liquid barrier on the substrate, placing a first circuit element on one side of the liquid barrier, and placing a second circuit element on the opposite side of the liquid barrier. A liquid is applied to the first circuit element. The method further includes using the liquid barrier to prevent the liquid applied to the first circuit element from contaminating the second circuit element so that the spacing between the first and second circuit elements can be minimized.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the invention given below.

DETAILED DESCRIPTION

Figure 1:
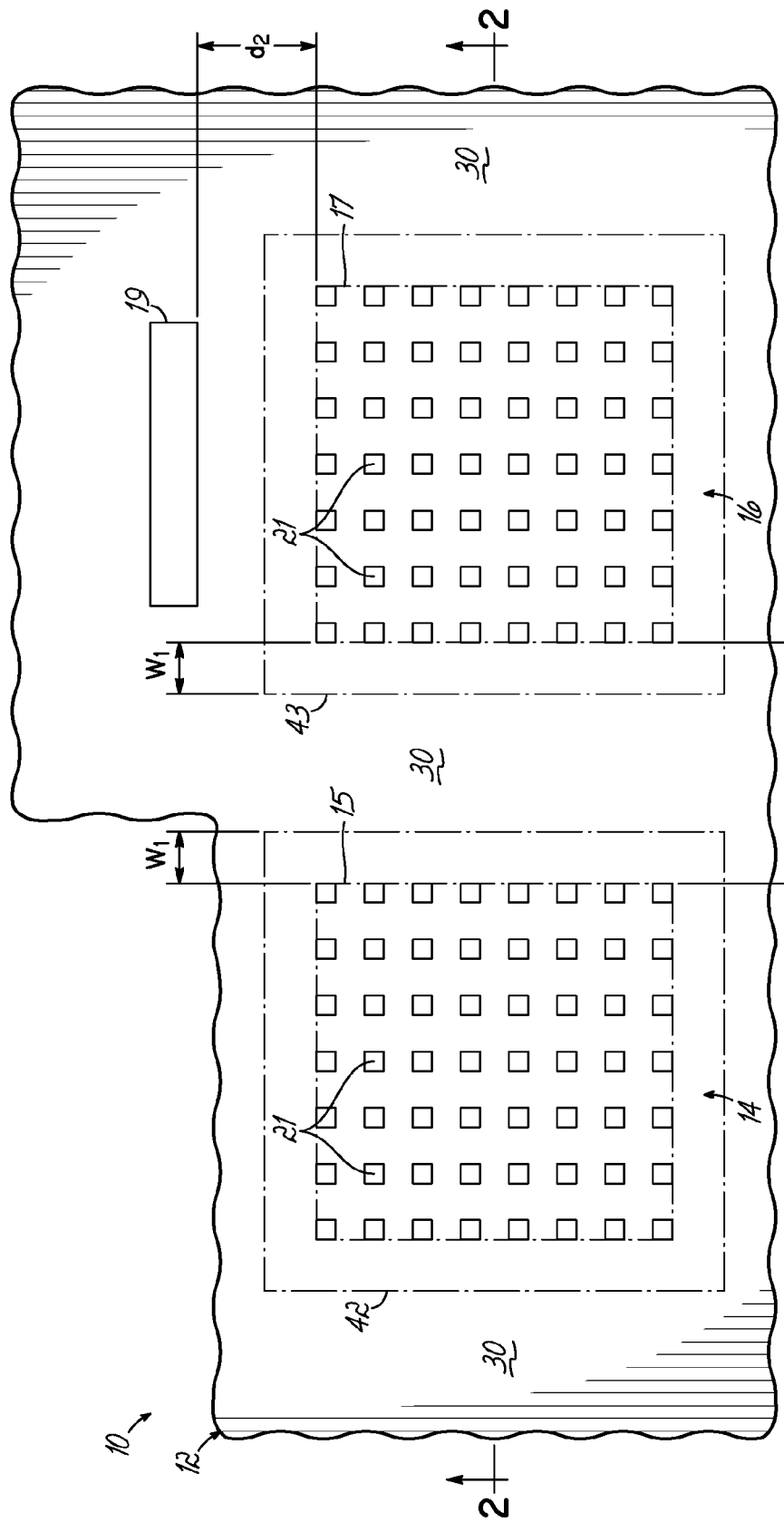
FIG. 1 is a top view of a portion of an electronics assembly processed in accordance with an embodiment of the invention and in which the die are omitted for clarity of description.
Figure 2:
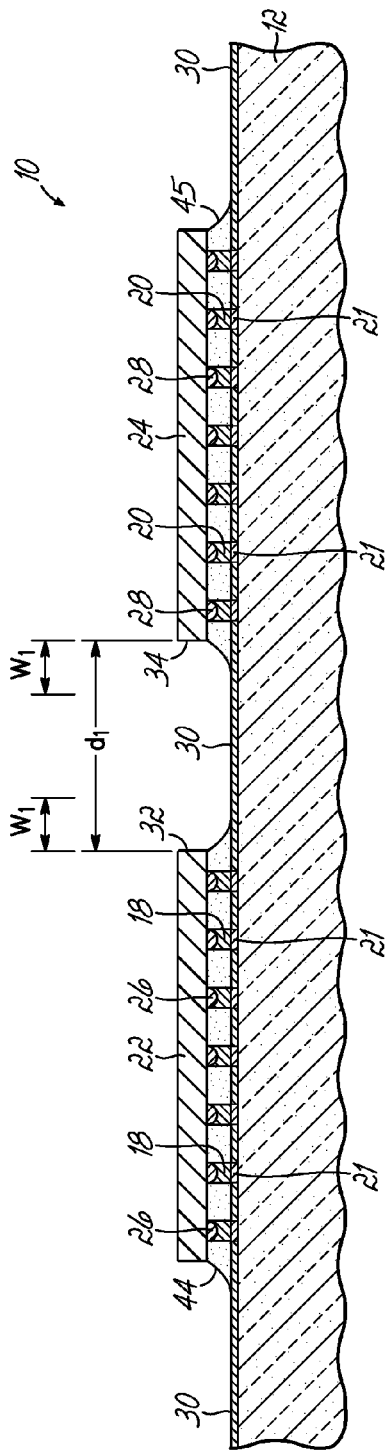
FIG. 2 is a cross-sectional view taken generally along line 2-2—in FIG. 1 after die have been attached to the bond pads and underfill material has been introduced beneath the die.

With reference to FIGS. 1 and 2, an electronics assembly 12 includes a substrate 10 (for example, a circuit board or a leadframe) having two groups 14, 16 of bond pads 21. Each of the bond pads 21 comprises a circuit element of the electronics assembly. In the representative embodiment, the bond pads 21 in each of the groups 14, 16 are arranged in an array of rows and columns. The bond pads 21 of group 14 are located inside an outer boundary 15 of an attachment site and, similarly, the bond pads 21 of group 14 are located inside an outer boundary 17 of another attachment site. While only two attachment sites comprised of the different groups 14, 16 of bond pads 21 are shown, the substrate 10 may include any number of attachment sites in accordance with the requirements for the electronic components to be attached to form a particular electronics assembly 12. In representative embodiments, the electronics assembly 12 may be a flip chip, chip scale package (CSP), ball grid array (BGA) or package-on-package assembly (PoP), for example.

Each of the groups 14, 16 of bond pads 21 represents a nominal area on the substrate 10 designated for the attachment of a die. The dimensions of the outer boundaries 15, 17 may vary and depends, at least in part, on the desired size of the electronics assembly 12. Generally, the outer boundaries 15, 17 surrounding the bond pads 21 are less than 25 mm in both length and width. Each of the bond pads 21, or at least an uppermost layer of the bond pads 21, is comprised of a layer of material, such as copper, for forming the electrical connection.

A layer 30 comprised of a solder mask material, or another type of organic-based material used in the die attach process, is applied to the surface of the substrate 10 in regions outside of the outer boundaries 15, 17. The solder mask layer 30, which may be comprised of silicon dioxide ($SiO_2$) particles in an organic polymer matrix, is applied to the surface of the substrate 10 and is modified or applied so that the bond pads 21 are not covered by the solder mask material. The solder mask layer 30 may be applied to the substrate 10 during the manufacture of the substrate 10.

After application, the solder mask layer 30 is modified in order to change the response of the solder mask material 30 to the application of a liquid or fluid material, such as an underfill material. In a representative embodiment, the substrate 10 is placed into a plasma treatment system 40, such as the one shown in FIG. 3, to surface treat the solder mask layer 30.

Figure 3:
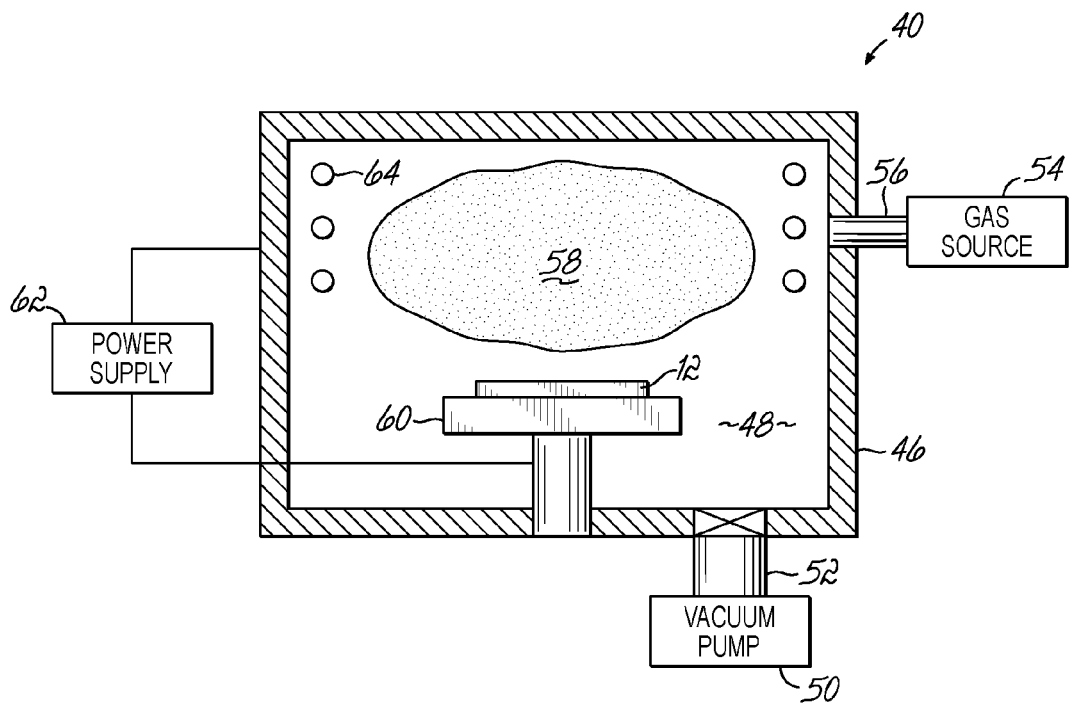
FIG. 3 is a diagrammatic view of a plasma treatment system for plasma processing the substrate in accordance with the principles of the invention.

FIG. 3 illustrates a plasma treatment system 40 suitable for the surface modification process that changes the surface energy of the solder mask layer 30. The plasma treatment system 40 includes a treatment chamber 46 constituted by walls that enclose a processing space 48. During a plasma process, such as the surface modification process described in greater detail below, the treatment chamber 46 is sealed fluid-tight from the surrounding ambient environment, evacuated to a suitable partial vacuum, and supplied with at least one process gas that is appropriate for the intended plasma treatment. A vacuum pump 50 is used to evacuate the processing space of the treatment chamber through a valved vacuum port 52. The vacuum pump 50 may comprise one or more vacuum pumping devices with controllable pumping speeds as recognized by persons of ordinary skill in the art of vacuum technology.

One or more process gases are admitted at a regulated flow rate to the processing space from a process gas source 54 through an inlet gas port 56. The flow of process gas from the process gas source 54 to the processing space 48 is typically metered by a mass flow controller. The gas flow rate from the process gas source 54 and the pumping rate of vacuum pump 50 are adjusted, as needed, to create a plasma-processing pressure that is suitable for generation of a plasma 58 and the intended treatment process. In this way, fresh process gases are continuously supplied to the processing space 48 when the plasma 58 is present and any spent process gas and/or volatile species removed from the processed substrate 10 on a substrate support 60 are eliminated.

A power supply 62 is electrically coupled with, and transfers electrical power to, an electrode 64 that is inside of the chamber 46. Power transferred from the power supply 62 to the electrode 64 is effective for forming the plasma 58 from the process gas confined within the processing space 48. The power supply 62 may also energize an electrode (referred to herein as a "bias electrode") associated with the substrate support 60. Power transferred from the power supply 62 to the bias electrode is effective for electrically biasing the substrate 10 relative to the plasma 58 and promoting the plasma-processing of the substrate 10. The power supply 62 may be one or more power supplies that control a direct current (DC) biasing and/or a radio-frequency (RF) power supply operating at a frequency between about 40 kHz and about 13.56 MHz and a power level ranging between about 50 watts and about 10,000 watts. Other appropriate frequencies and power ranges may also be used. Those of ordinary skill in the art will appreciate that different treatment chamber designs may permit or require different bias powers. A controller is coupled to the various components of the plasma treatment system 40 to facilitate control of the plasma processes. The plasma treatment system 40 is further understood to include components not shown in FIG. 3 and which may be necessary for operation of the system 40, such as a gate valve disposed between the processing space 48 and the vacuum pump 50.

Returning now to the surface modification process, a process gas is introduced into the processing space 48, for example, argon (Ar), with or without another gas such as hydrogen ($H_2$) if etch cleaning is desired. RF power ranging from about 0.02 W/cm$^2$ to about 0.65 W/cm$^2$ is supplied from the power supply 62 to the electrode 64, which energizes the process gas within the processing space 48 into the plasma 58. The process gas is switched to tetrafluoromethane ($CF_4$), or alternatively, $CF_4$ may be injected into the process space and excited concurrently with the injection of Ar, $H_2$, or other process gases. Other process gases comprising fluorine, such $CHF_3$, $C_2F_6$, $NF_3$, $SF_6$, may be used as the fluorinating agent in the process gas.

With the plasma 58 formed in the chamber 48, the power supply 62 supplies DC power to the bias electrode to attract ions from the plasma 58 and toward the now biased substrate 10. Accordingly, the surface of the solder mask layer 30 is treated with the $CF_4$ plasma, which fluorinates the organic polymer of the material comprising the solder mask layer 30 and thereby modifies the properties of the solder mask layer 30.

The plasma modification lowers the surface energy of the organic material comprising the solder mask layer 30. Specifically, fluorination increases the hydrophobicity of the solder mask layer 30, which causes the resistance of the solder mask layer 30 to liquid wetting to increase over the entirety of the surface area on substrate 10 that is covered by the solder mask layer 30. Hydrophobicity can be measured by the affinity of the solder mask layer 30 for water, and may also be referred to as wettability. The degree of hydrophobicity of the hydrophobic surface of the solder mask layer 30 can be measured by the contact angle made by a droplet of water on the surface of the solder mask layer 30. In one embodiment, the plasma-modified solder mask layer 30 is considered hydrophobic if the contact angle is greater than or equal to 90°.

With renewed reference to FIGS. 1 and 2, circuit elements in the representative form of die 22, 24 are electrically and mechanically attached to the bond pads 21 by solder joints. Each of the die 22, 24 includes one or more integrated circuits with active devices, such as CMOS field-effect transistors. A circuit element 19 is also provided at an attachment site on the substrate 10 as an optional part of the electronics assembly 12. The circuit element 19 may be a passive device, such as a resistor, a capacitor, or an inductor.

Bumps 18, 20 are applied to the bond pads 26, 28 on die 22, 24, to the bond pads 21 on the substrate 10, or to both. A die attach process is performed to form joints that define electrical and mechanical connections extending between the bond pads 26, 28 of the die 22, 24 and the groups 14, 16 of bond pads 21 on the substrate 10. In the illustrated flip chip attachment method, a mold tray carrying bumps 18, 20 comprised of solder is aligned with the groups 14, 16 of bond pads 21 and the bond pads 28 on the die 22, 24. When sufficient pressure and/or temperature are applied, the solder in the bumps 18, 20 may reflow to form joints that physically and electrically bond the die 22, 24 to the groups 14, 16 of bond pads 21. Alternatively, the bumps 18, 20 may be comprised of a material other than solder, such as copper, and the attachment process can be thermosonic rather than reflow.

After the die 22, 24 are respectively attached to the the groups 14, 16 of bond pads 21, an underfilling operation is performed. The underfilling operation introduces underfill material 44, 45 into the open space beneath the die 22, 24 and surrounding the solder bumps 18, 20. The underfill material 44, 45 is a liquid, such as a curable non-conductive epoxy that may be filled with silicon dioxide particles, that is fluid when applied to the substrate 10 and that flows by capillary action into the open space.

The underfill material 44, 45 is dispensed as one or more deposited lines of dots of liquid on the contact zones 42, 43 by a jetting device. The dots deposit on the solder mask layer 30 proximate to one or more of the exterior edges 32, 34 of each die 22, 24. However, the underfill material 44, 45 may be applied to the substrate 10 using multiple different types of dispensers and in multiple different ways. Typically, the dispensed amount of underfill material 44, 45 is approximately equal to the volume of the open space under each of the die 22, 24 plus the volume of a fillet that forms along the die edge 32, 34 after the underfill operation has been completed.

The contact zones 42, 43 operate a liquid barrier formed on the substrate and thereby define the extent over which the underfill material 44, 45 contacts the solder mask layer 30 when initially dispensed onto the substrate 10. The plasma treatment increases the resistance of the solder mask layer 30 to wetting by the underfill material 44, 45 and prevents or significantly reduces flow of the underfill material 44, 45 away from the die 22, 24. In particular, the underfill material 44, 45 does not migrate beyond the contact zones 42, 43 and across the space between the adjacent die 22, 24 to cause contamination. The contact zones 42, 43 have a width, $w_1$, of a numerical value that reflects the plasma modification increasing the hydrophobicity of the solder mask layer 30, the dimensions of the underfill material 44, 45 when initially dispensed on the solder mask layer 30, and the properties (e.g., viscosity) of the underfill material 44, 45 in its dispensed state.

The contact zone 42 is defined as an area on the surface of the solder mask layer 30 and represents a minimum width, $w_1$, measured relative to the outer boundary 15 over which the plasma-modified solder mask layer 30 is wetted by the dispensed underfill material 44. The contact zone 42 surrounds the outer boundary 15 of the group 14 of bond pads 21. In an alternative embodiment, the contact zone 42 may be measured relative to a different reference, such as a nearest edge 32 of die 22 after the die 22 is attached to the group 14 of bond pads 21. The outer boundary 15 and edge 32 of die 22 may be aligned vertically or, if not vertically aligned, the contact zone 42 may be measured with reference to one or the other of the outer boundary 15 or edge 32. Because of the enhanced hydrophobicity of the solder mask layer 30, underfill material 44 applied adjacent to the edge 32 of the die 22 does not migrate outside of the contact zone 42 for transfer to die 24 and thereby cause contamination of die 24. The contact zone 42 may represent a minimum spacing of separation between the adjacent die 22, 24 for which the underfill material 44 will not flow to reach the die 24.

The contact zone 43 is defined as an area on the surface of the solder mask layer 30 and represents the minimum width, $w_1$, measured relative to the outer boundary 17 over which the plasma-modified solder mask layer 30 is wetted by the dispensed underfill material 45. The contact zone 43 surrounds the outer boundary 17 of the group 16 of bond pads 21. In an alternative embodiment, the contact zone 43 may be measured relative to a different reference, such as a nearest edge 34 of die 24 after the die 24 is attached to the group 16 of bond pads 21. The outer boundary 17 and edge 34 of die 24 may be aligned vertically or, if not vertically aligned, the contact zone 43 may be measured with reference to one or the other of the outer boundary 17 or edge 34. Because of the enhanced hydrophobicity of the solder mask layer 30, underfill material 45 applied adjacent to the edge 34 of the die 24 does not migrate outside of the contact zone 43 for transfer to die 22 and thereby cause contamination of die 22. The contact zone 43 may represent a minimum spacing of separation between the adjacent die 22, 24 for which the underfill material 45 will not flow to reach the die 22.

The minimum spacing, $d_1$, between the outer boundaries 15, 17 for the different groups 14, 16 of bond pads 21 may be reduced by the enhanced hydrophobicity of the solder mask layer 30. In one embodiment, the minimum spacing, $d_1$, may be approximately equal to the sum of the respective widths, $w_1$, of the contact zones 42, 43. The minimum spacing, $d_1$, and contact zones 42, 43 have a lower limit related to the space needed as a landing zone for underfill material dispensed adjacent to the outer boundaries 15, 17. In particular, the dimensions (e.g., dot size or line width) of the dispensed underfill material may supply a determinative factor on the respective widths, $w_1$, of the contact zones 42, 43 and the minimum spacing, $d_1$, between the outer boundaries 15, 17, rather than any propensity of the underfill material 44, 45 to migrate away from the dispensed location. The minimum spacing, $d_2$, separating the outer boundary 17 and the electronic component 19 may similarly be reduced to be approximately equal to the width, $w_1$, of the contact zone 43. The enhanced hydrophobicity of the solder mask layer 30 removes or at least reduces migration of the underfill material 44, 45 as a limiting factor on the minimum spacings $d_1$, $d_2$.

The dimensions of the contact zones 42, 43 may be taken into account when designing the layout of the groups 14, 16 of bond pads 21 for the electronics assembly 12. The minimum spacings $d_1$, $d_2$ may be 450 μm or less, which is considerably smaller than the conventional minimum spacings of 900 μm or larger. The reduction in the minimum spacing permits the the outer boundaries 15, 17 for the different groups 14, 16 of bond pads 21 to be placed in closer proximity to each other, which conserves space on the surface of the substrate 10.

After the underfill material 44, 45 moves beneath the die 22, 24, the underfill material 44, 45 is cured and hardened by a timed heating procedure. The underfill material 44, 45 may be cured in some type of convective oven, radiant oven, or microwave-curing oven situated in-line after the fluid dispenser. When cured and hardened, the underfill forms a strongly bonded, cohesive mass. The cured underfill 44, 45 protects the solder joints against various adverse environmental factors, redistributes mechanical stresses due to shock, and prevents the solder joints from moving under strain during thermal cycles.

In an alternative embodiment, a fluxing (no-flow) underfill process may be used to supply the underfill material 44, 45. During the assembly process, the no-flow underfill is applied to the attachment site before the die is placed. During reflow, the underfill performs as a flux, allows the metallic interconnection to form, and completes the underfill cure in the reflow oven.

Figure 4:
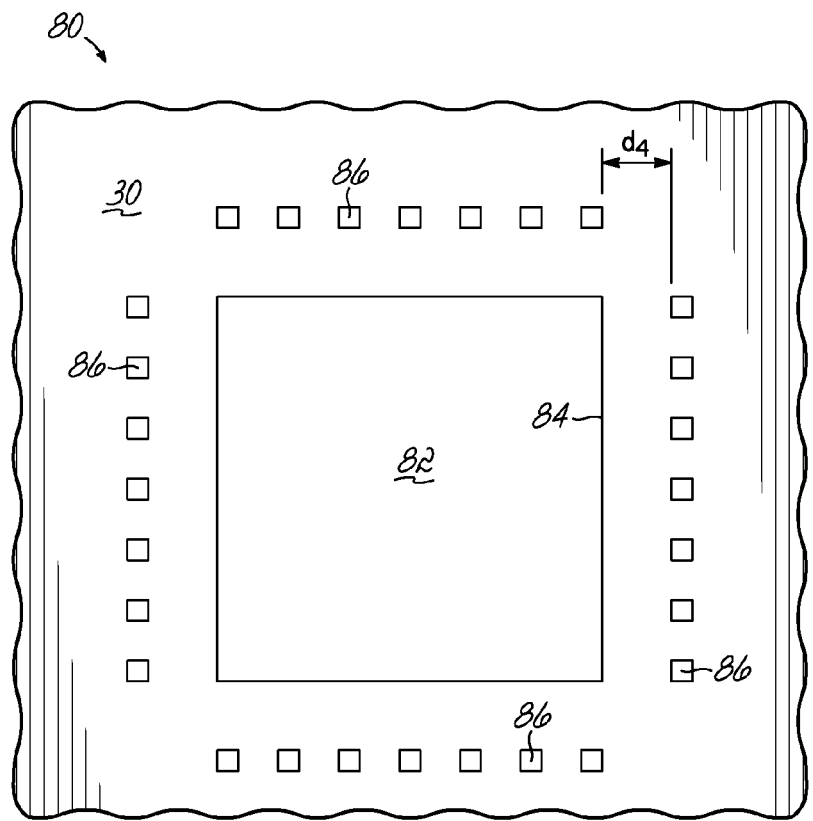
FIG. 4 is a top view similar to FIG. 1 in accordance with an alternative embodiment of the invention.

With reference to FIG. 4 in which like reference numerals refer to like features in FIGS. 1-3 and in accordance with an alternative embodiment of the invention, a substrate 80 used to form an electronics assembly includes a die attach pad 82 representing an attachment site with an outer boundary 84. A plurality of bond pads 86 are distributed at various positions about the outer circumference or boundary 84 of the die attach pad 82. At least the area surrounding the die attach pad 82 is covered by the solder mask layer 30. Each of the bond pads 86 comprises a circuit element of the electronics assembly.

The die attach pad 82 represents a nominal area on the substrate 80 designated for the attaching a die to form an assembly similar to assembly 12 (FIGS. 1, 2). The attachment process involves dispensing a die attach adhesive as a liquid over the surface area of the die attach pad 82 and using a pick and place machine to position a die in a contacting relationship with the adhesive on the die attach pad 82. The die attach adhesive provides both the thermal and mechanical interface between the die and the die attach pad 82. When the die attach pad 80 is placed into the contacting relationship with the die attach adhesive and pressed toward the top surface of the substrate 10, the die attach adhesive is displaced outwardly toward the outer boundary 84 and typically is displaced beyond the outer boundary 84. A portion of the displaced adhesive may form a filet adjacent to the die edge and extending up the die edge.

The bond pads 86 are relatively small and therefore highly sensitive to contamination by the die attach adhesive. To prevent migration of the die attach adhesive to the bond pads 86, the solder mask layer 30 is plasma treated as described above. The minimum spacing, $d_4$, between the bond pads 86 and the outer boundary 84 of the die attach pad 82 may be significantly reduced because of the increased hydrophobicity of the plasma-treated solder mask layer 30. The reduction in the minimum spacing, $d_4$, permits the bond pads 86 to be placed in closer proximity to the die attach pad 82 than in conventional electronics assemblies, which conserves space on the surface of the substrate 10.

A wirebonding process is then uses to couple wires between bond pads on the top surface of the die and the bond pads 86 distributed about the die attach pad 82. The enhanced hydrophobicity of the solder mask layer 30 prevents contamination of the bond pads 86 from the migration of the die attach adhesive.

Figure 5:
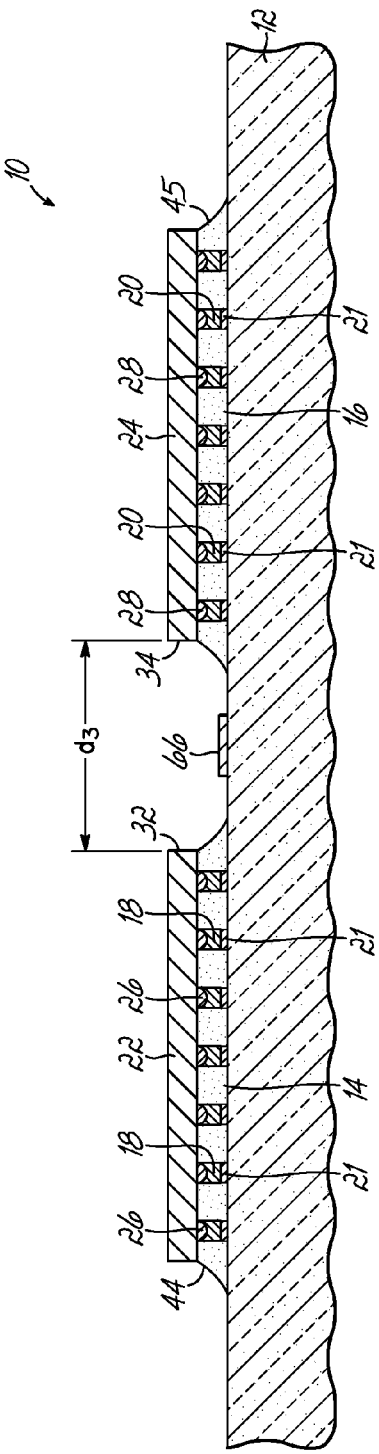
FIG. 5 is a cross-sectional view similar to FIG. 2 in accordance with an alternative embodiment of the invention.

With reference to FIG. 5 in which like reference numerals refer to like features in FIGS. 1-4 and in accordance with an alternative embodiment of the invention, a dam 66 is formed on the substrate 10 in which the solder mask material 30 is absent. The dam 66 is positioned between the outer boundary 15 of the group 14 of bond pads 21 and the outer boundary 17 of the group 16 of bond pads 21 along the nearest-neighbor side edges 32, 34 of the die 22, 24. The dam 66 is formed as a linear body at a location between the edges 32, 34 of the die 22, 24. In an alternative embodiment, the dam 66 may surround one or the other of the die 22, 24. In another embodiment, multiple dams like dam 66 may be present. In another embodiment, a dam similar to dam 66 may be positioned between the side edge 34 of die 24 and the circuit element 19 (FIG. 1).

The dam 66 operates a liquid barrier formed on the substrate 10. To that end, the dam 66 may be constructed with a height that is sufficient to prevent the dispensed underfill material 44 from migrating to die 24 or to prevent the dispensed underfill material 45 from migrating to die 22. The dam 66 is comprised of a hydrophobic material that resists wetting by the underfill material 44, 45. In a specific embodiment, the dam 66 is comprised of a hydrophobic, plasma-polymerized material, such as tetramethyldisiloxane ("TMDSO").

According to one embodiment of the invention, the dam 66 is formed by positioning a mask, such as an aluminum mask, above or in contacting relationship with the substrate 10. The masked substrate 10 is then placed within a processing chamber, such as the treatment chamber 46 described previously with reference to FIG. 3. The controller adjusts the operation of the vacuum pump 50 and the gas introduction in order to maintain a desired processing pressure. RF power ranging from about 0.02 W/cm$^2$ to about 0.65 W/cm$^2$ is supplied from the power supply 62 to the electrode 64, which energizes the process gas within the processing space 48 into the plasma 58. In one embodiment, the process gas may be a mixture of Ar and a monomer gas such as siloxanes or, in one embodiment, the TMDSO. TMDSO may be introduced by supplying liquid TMDSO in a separate evaporation chamber (not shown specifically, but included within the gas source 54) that is fluidically coupled to the processing space 48. Because the vapor pressure of TMDSO is 112.5 mTorr at 20° C., once a suitable process pressure is established inside chamber 46, TMDSO will readily evaporate and enter the processing space 48 at flow rates that range from about 1 sccm to about 1000 sccm. In an alternative embodiment, a carrier gas may be used for transporting the monomer vapor to the processing space 48 as is well known to those of ordinary skill in the art and would be considered to be consistent with the embodiments of the invention. The process pressure in chamber 46 may be kept in a range from about 20 mTorr to about 200 mTorr as the TMDSO is introduced.

The TMDSO in the plasma 58 selectively forms a polymer layer on the unmasked surfaces of the substrate 10. With deposition of the dam 66 complete, the introduction of the process gas is stopped, the plasma processing ends, and the substrate 10 is removed from the plasma treatment system 40. The flip chip process may then follow as described above.

The dam 66 prevents migration of the underfill material 44 from the dispensed location adjacent to die 22 to die 24. The dam 66 likewise prevents migration of the underfill material 45 from the dispensed location adjacent to die 24 to die 22. The minimum spacing, $d_3$, between the outer boundaries 15, 17 may be significantly reduced because of the presence of the dam 66. The reduction in the minimum spacing, $d_3$, permits the die 22, 24 to be more closely packed than in conventional electronics assemblies, which conserves space on the surface of the substrate 10. In one embodiment, the height of the dam 66 may be approximately 200 nm and the width of the dam may be approximately 100 nm.

Figure 6:
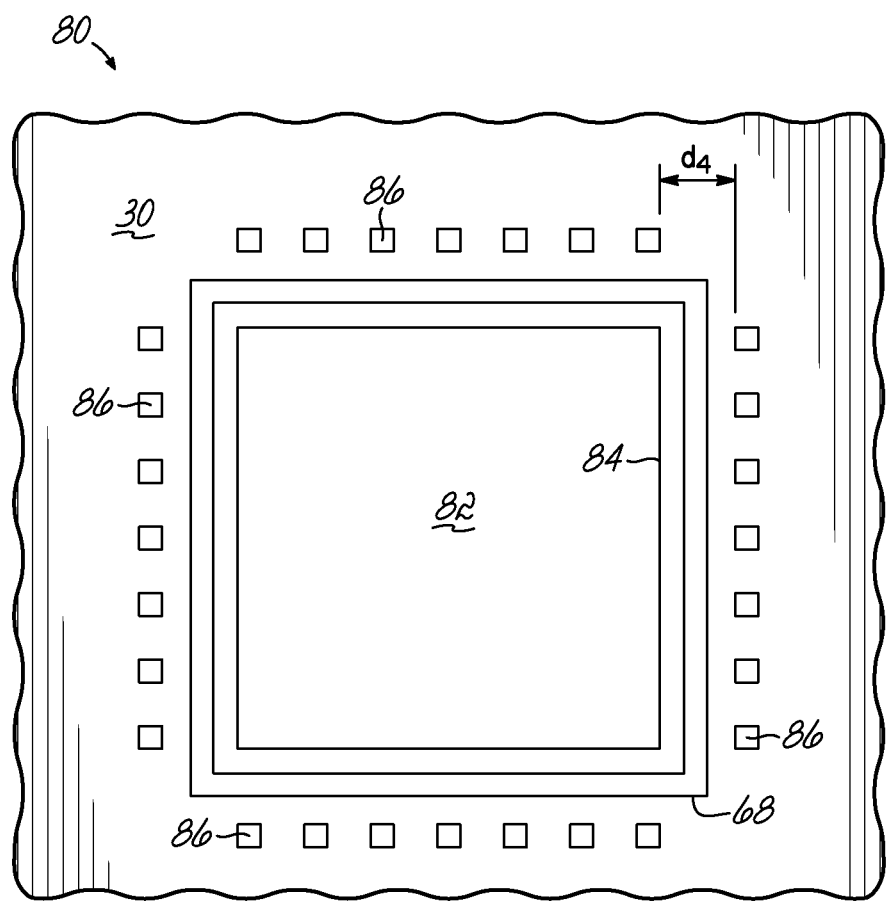
FIG. 6 is a top view similar to FIG. 4 in accordance with an alternative embodiment of the invention.

With reference to FIG. 6 in which like reference numerals refer to like features in FIGS. 1-5 and in accordance with an alternative embodiment of the invention, a dam 68 is positioned between the die attach pad 82 and the bond pads 86. The dam 68 surrounds the die attach pad 82. The dam 68 is formed in the same manner as dam 66 (FIG. 5) and has a construction similar or identical to dam 66. The dam 68 prevents migration of the die attach adhesive from the die attach pad 82 to the bond pads 86. The minimum spacing, $d_4$, between the die attach pad 82 and the bond pads 86 may be significantly reduced because of the presence of the dam 68.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Furthermore, to the extent that the terms "includes", "having", "has", "with", "composed of", or variants thereof are used in either the detailed description or the claims, such terms are intended to be inclusive in a manner similar to the term "comprising."

It will be understood that when an element is described as being "connected" or "coupled" to or with another element, it can be directly connected or coupled to the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

While the invention has been illustrated by a description of various embodiments and while these embodiments have been described in considerable detail, it is not the intention of the applicant to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described.

What is claimed is:

1. A method of fabricating an electronics assembly having a substrate and a plurality of circuit elements, comprising:
    applying a layer of a solder mask material to the substrate;
    exposing the layer to a fluorine-containing plasma to fluorinate the solder mask and thereby increase a hydrophobicity of the solder mask material;
    placing a first circuit element on the substrate;
    placing a second circuit element on the substrate; and
    applying a liquid to the first circuit element,
    wherein the exposure of the layer to the fluorine-containing plasma prevents the liquid applied to the first circuit element from flowing to contaminate the second circuit element so that the spacing between the first and second circuit elements can be minimized.

2. The method of claim 1 wherein the liquid is an underfill material, the first circuit element is a die, and applying the liquid to the first circuit element comprises:
    dispensing the underfill material onto the layer over a contact zone adjacent to an edge of the die.

3. The method of claim 2 wherein the second circuit element is a die.

4. The method of claim 1 wherein the liquid is an adhesive, the first circuit element is a die, and applying the liquid to the first circuit element comprises:
    dispensing the adhesive onto a die attach pad on the substrate.

5. The method of claim 4 wherein the second circuit element is a bond pad.

6. The method of claim 1 wherein the liquid is an adhesive, the first circuit element is a die, and applying the liquid to the first circuit element comprises:
    dispensing the adhesive onto a die attach pad on the substrate; and
    contacting the die with the adhesive on the die attach pad.

7. The method of claim 1 wherein the liquid is an underfill material, the first circuit element is a die, and applying the liquid to the first circuit element further comprises:
    dispensing the underfill material adjacent to an edge of the die.

8. The method of claim 1 wherein the first circuit element is a first die and the second circuit element is a second die.

9. The method of claim 1 wherein the first circuit element is a first die and the second circuit element is a bond pad on the substrate.

* * * * *